(12) United States Patent
Tanno et al.

(10) Patent No.: US 9,006,818 B2
(45) Date of Patent: Apr. 14, 2015

(54) INSULATED GATE FIELD EFFECT TRANSISTOR AND METHOD OF MANUFACTURING THE SAME

(71) Applicant: JTEKT Corporation, Osaka, Osaka (JP)

(72) Inventors: Satoshi Tanno, Kashihara (JP); Yasuyuki Wakita, Kashihara (JP)

(73) Assignee: JTEKT Corporation, Osaka (JP)

( * ) Notice: Subject to any disclaimer, the term of this patent is extended or adjusted under 35 U.S.C. 154(b) by 0 days.

(21) Appl. No.: 14/180,817

(22) Filed: Feb. 14, 2014

(65) Prior Publication Data
US 2014/0239381 A1    Aug. 28, 2014

(30) Foreign Application Priority Data
Feb. 22, 2013    (JP) ................. 2013-033181

(51) Int. Cl.
*H01L 29/78*    (2006.01)
*H01L 29/66*    (2006.01)
*H01L 27/02*    (2006.01)

(52) U.S. Cl.
CPC ...... *H01L 29/7838* (2013.01); *H01L 29/66568* (2013.01); *H01L 27/0288* (2013.01); *H01L 27/0251* (2013.01)

(58) Field of Classification Search
CPC .............. H01L 29/78; H01L 29/78696; H01L 29/0847; H01L 27/10876; H01L 29/7838; H01L 29/66568

USPC .................... 257/327, 331, 396; 438/268, 270
See application file for complete search history.

(56) References Cited

U.S. PATENT DOCUMENTS

| | | | |
|---|---|---|---|
| 6,900,102 B2 | 5/2005 | Lee et al. | |
| 2007/0072352 A1 | 3/2007 | Kushiyama et al. | |
| 2014/0097478 A1* | 4/2014 | Siemieniec et al. | 257/256 |
| 2014/0159142 A1* | 6/2014 | Lim et al. | 257/330 |

FOREIGN PATENT DOCUMENTS

JP    A-2007-96034    4/2007

OTHER PUBLICATIONS

Extended European Search Report issued in European Application No. 14156016.9 mailed Jun. 6, 2014.

* cited by examiner

*Primary Examiner* — Minh-Loan Tran
(74) *Attorney, Agent, or Firm* — Oliff PLC

(57) ABSTRACT

An insulated gate field effect transistor configured to reduce the occurrence of a short-circuit fault, and a method of manufacturing the insulated gate field effect transistor are provided. A FET includes a semiconductor substrate, a gate insulator, a gate electrode, and a conductive member. The semiconductor substrate has an insulation groove that splits a channel region into a first channel region on a drain region side and a second channel region on a source region side. The conductive member is supported by a drain-side end face and a source-side end face of the insulation groove. When the temperature of the conductive member is equal to or higher than a predetermined temperature, the conductive member is cut.

15 Claims, 8 Drawing Sheets

INSULATED GATE FIELD EFFECT TRANSISTOR AND METHOD OF MANUFACTURING THE SAME

INCORPORATION BY REFERENCE

The disclosure of Japanese Patent Application No. 2013-033181 filed on Feb. 22, 2013 including the specification, drawings and abstract, is incorporated herein by reference in its entirety.

BACKGROUND OF THE INVENTION

1. Field of the Invention

The invention relates to an insulated gate field effect transistor and a method of manufacturing the insulated gate field effect transistor.

2. Description of Related Art

An insulated gate field effect transistor described in Japanese Patent Application Publication No. 2007-96034 (JP 2007-96034 A) includes a p-type semiconductor substrate. The semiconductor substrate has an n-type drain region and an n-type source region formed on the surface thereof. A gate electrode is formed on the surface of a channel region which is formed between the drain region and the source region, with a gate insulator interposed between the channel region and the gate electrode.

If an abnormality occurs in the insulated gate field effect transistor due to, for example, supply of an excessively large current or voltage to the transistor, a drain terminal and a source terminal may be short-circuited, that is, a so-called short-circuit fault may occur. If a short-circuit fault occurs in the insulated gate field effect transistor, electric power is constantly supplied to other devices through the transistor. Consequently, the influence on the other devices increases.

SUMMARY OF THE INVENTION

One object of the invention is to provide an insulated gate field effect transistor configured to reduce the occurrence of a short-circuit fault, and a method of manufacturing the insulated gate field effect transistor.

An insulated gate field effect transistor according to an aspect of the invention includes: a semiconductor substrate having a drain region, a source region, a channel region, and an insulation groove that splits the channel region into a first channel region located on the drain region side and a second channel region located on the source region side; a gate electrode having a first gate electrode portion that forms the first channel region in the semiconductor substrate, and a second gate electrode portion that forms the second channel region in the semiconductor substrate; a gate insulator that is located between the semiconductor substrate and the gate electrode and that insulates the gate electrode from the drain region and the source region; and a conductive member that is supported by a drain-side end face of the insulation groove, the drain-side end face being an end face on the drain region side, and a source-side end face of the insulation groove, the source-side end face being an end face on the source region side, and that is cut when a temperature of the conductive member is higher than or equal to a predetermined temperature.

In the insulated gate field effect transistor according to the above-described aspect, the conductive member is supported by the drain-side end face and the source-side end face. That is, the first channel region and the second channel region are connected via the conductive member. Therefore, when the temperature of the conductive member is higher than or equal to the predetermined temperature due to occurrence of an abnormality or the like in the insulated gate field effect transistor, the conduction between the drain terminal and the source terminal is interrupted. Thus, it is possible to reduce the occurrence of a short-circuit fault.

A method of manufacturing the insulated gate field effect transistor according to another aspect of the invention, includes: a step of forming a recess in a substrate material of the semiconductor substrate; a step of forming a positioning portion in the recess such that the positioning portion extends up to a position lower than an opening portion of the recess; a step of forming the conductive member on a surface of the positioning portion; a step of forming the drain region and the source region in the substrate material; a step of forming the semiconductor substrate by forming the gate insulator on a surface of the drain region, a surface of the source region, and a surface of the conductive member; and a step of removing the positioning portion from the semiconductor substrate.

In the insulated gate field effect transistor manufactured by the method according to the above-described aspect, the conductive member is supported by the drain-side end face and the source-side end face. That is, the first channel region and the second channel region are connected via the conductive member. Therefore, when the temperature of the conductive member becomes equal to or higher than the predetermined temperature due to, for example, the occurrence of an abnormality in the insulated gate field effect transistor, the conduction between the drain terminal and the source terminal is interrupted. Thus, it is possible to reduce the occurrence of a short-circuit fault.

With the insulated gate field effect transistor and the method of manufacturing the insulated gate field effect transistor, it is possible to reduce the occurrence of a short-circuit fault.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
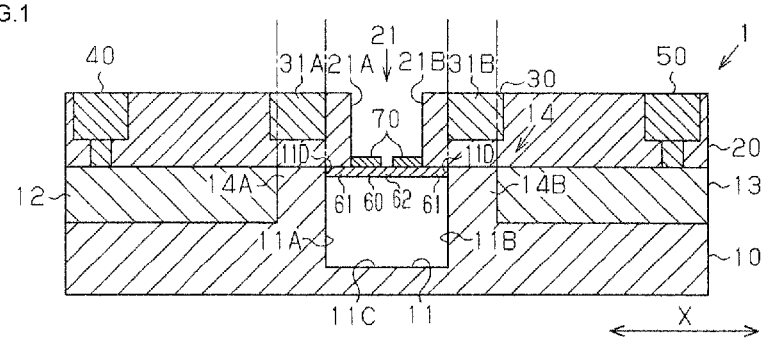
FIG. 1 is a sectional view illustrating the sectional structure of an insulated gate field effect transistor according to a first embodiment of the invention.

Hereinafter, example embodiments of the invention will be described with reference to the accompanying drawings. As illustrated in FIG. 1, an insulated gate field effect transistor 1 (hereinafter, referred to as "FET 1") includes a semiconductor substrate 10 made of a p-type silicon semiconductor. The FET 1 includes the semiconductor substrate 10, a gate insulator 20, a gate electrode 30, a drain terminal 40, a source terminal 50, a conductive member 60, and a bimetal 70.

The semiconductor substrate 10 has an insulation groove 11. The semiconductor substrate 10 has an n-type drain region 12, an n-type source region 13, and a channel region 14. The insulation groove 11 is formed as a groove that extends in the semiconductor substrate 10, in a depth direction that is perpendicular to the sheet on which FIG. 1 is drawn and that is away from a person seeing FIG. 1. The insulation groove 11 has a drain-side end face 11A, a source-side end face 11B, a bottom face 11C, and an opening portion 11D in a section orthogonal to the depth direction.

The drain-side end face 11A is formed as an end face of the insulation groove 11, the end face being on the drain region 12 side in a lateral direction X in FIG. 1. The source-side end face 11B is formed as an end face of the insulation groove 11, the end face being on the source region 13 side in the lateral direction X in FIG. 1.

The drain region 12 is formed in the semiconductor substrate 10, at a position on its surface side and on the left side of the insulation groove 11 in the lateral direction X. The source region 13 is formed in the semiconductor substrate 10, at a position on its surface side and on the opposite side of the insulation groove 11 from the drain region 12 in the lateral direction X.

The channel region 14 is formed at a position between the drain region 12 and the source region 13 in the lateral direction X. The channel region 14 has a first channel region 14A and a second channel region 14B.

The first channel region 14A is located between the drain region 12 and the drain-side end face 11A in the lateral direction X. The second channel region 14B is located between the source region 13 and the source-side end face 11B in the lateral direction X.

The gate insulator 20 is formed on the surface of the semiconductor substrate 10. The gate insulator 20 has an insulator splitting portion 21. The gate insulator 20 is formed as an oxide film. The gate insulator 20 is split into two portions in the lateral direction X by the insulator splitting portion 21.

The insulator splitting portion 21 is formed at a position corresponding to the insulation groove 11 in the lateral direction X. The insulator splitting portion 21 is formed as a groove that has a bottom face defined by the bimetal 70 and the conductive member 60, and that splits the gate insulator 20 into a portion on a first gate electrode portion 31A side and a portion on a second gate electrode portion 31B side. The insulator splitting portion 21 has a first end face 21A and a second end face 21B.

The first end face 21A is located closer to the source region 13 than the drain-side end face 11A in the lateral direction X. The second end face 21B is located closer to the drain region 12 than the source-side end face 11B in the lateral direction X.

The gate electrode 30 has the first gate electrode portion 31A and the second gate electrode portion 31B. The gate electrode 30 is formed at a position on the gate insulator 20 surface side and between the drain region 12 and the source region 13 in the lateral direction X. The gate electrode 30 is not in contact with the semiconductor substrate 10.

The first gate electrode portion 31A is formed at a position between the drain region 12 and the drain-side end face 11A in the lateral direction X. The source region 13-side end portion of the first gate electrode portion 31A extends up to the position of the drain-side end face 11A in the lateral direction X. The source region 13-side end of the first gate electrode portion 31A coincides with the drain-side end face 11A in the lateral direction X.

The second gate electrode portion 31B is formed at a position between the source region 13 and the source-side end face 11B in the lateral direction X. The drain region 12-side end portion of the second gate electrode portion 31B extends up to the position of the source-side end face 11B in the lateral direction X. The drain region 12-side end of the second gate electrode portion 31B coincides with the source-side end face 11B in the lateral direction X.

The drain terminal 40 is embedded in the gate insulator 20. The drain terminal 40 is formed at such a position as to come into contact with the drain region 12. The drain terminal 40 is connected to a drain electrode (not illustrated).

The source terminal 50 is embedded in the gate insulator 20. The source terminal 50 is formed at such a position as to come into contact with the source region 13. The source terminal 50 is connected to a source electrode (not illustrated).

The conductive member 60 has end portions 61 on both sides in the lateral direction X and an intermediate portion 62 between the end portions 61. The surface of the conductive member 60 is flush with the surface of the semiconductor substrate 10. The conductive member 60 is formed as, for example, an aluminum film.

The end portion 61 on the drain region 12 side is supported by the opening portion 11D of the drain-side end face 11A. The end portion 61 on the source region 13 side is supported by the opening portion 11D of the source-side end face 11B.

The bimetal 70 is disposed on the surface of the intermediate portion 62. The bimetal 70 is split into two bimetal portions in the lateral direction X. The drain region 12-side bimetal portion of the bimetal 70 is supported by the first end face 21A of the insulator splitting portion 21. The source region 13-side bimetal portion of the bimetal 70 is supported by the second end face 21B of the insulator splitting portion 21.

The function of the FET 1 will be described. When voltage is applied to the gate electrode 30, the drain terminal 40 and the source terminal 50 are electrically connected to each other via the drain region 12, the first channel region 14A, the conductive member 60, the second channel region 14B, and the source region 13.

In the event of occurrence of an abnormality of the FET 1, a fault (open fault) occurs in the FET 1, that is, the FET 1 is placed in the state where the conduction between the drain terminal 40 and the source terminal 50 is interrupted. A process leading to occurrence of an open fault in the FET 1 will be described with reference to FIG. 2A and FIG. 2B.

Figure 2A:
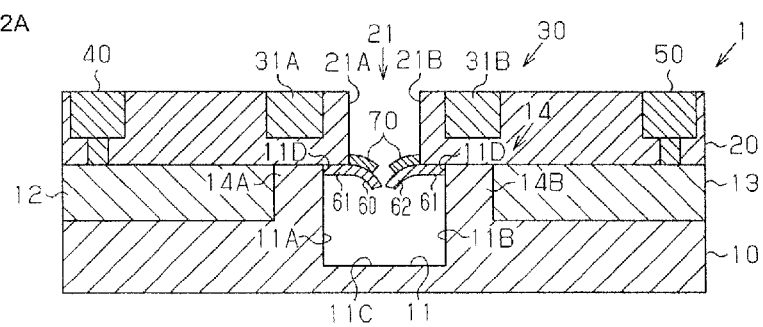
FIG. 2A is a sectional view illustrating the sectional structure of the insulated gate field effect transistor according to the first embodiment of the invention when the temperature of a conductive member is equal to or higher than a predetermined temperature.

As illustrated in FIG. 2A, when the temperature of the conductive member 60 increases due to, for example, supply of excessively large current or voltage, the temperature of the bimetal 70 also increases. When the temperature of the bimetal 70 has reached a high temperature, an end portion of each of the two bimetal portions of the bimetal 70, the end portion being on the center side of the bimetal 70, is bent toward the conductive member 60. The end portions on the center side of the bimetal 70 press the conductive member 60. Thus, the conductive member 60 is deformed. Then, when the temperature of the conductive member 60 has reached a temperature higher than a predetermined temperature, due to an increase in the deformation amount of the bimetal 70, the conductive member 60 is cut under pressure. Thus, the conduction between the first channel region 14A and the second channel region 14B is interrupted. Thus, the conduction between the drain region 12 and the source region 13 is interrupted. That is, the conduction between the drain terminal 40 and the source terminal 50 is interrupted.

Figure 2B:
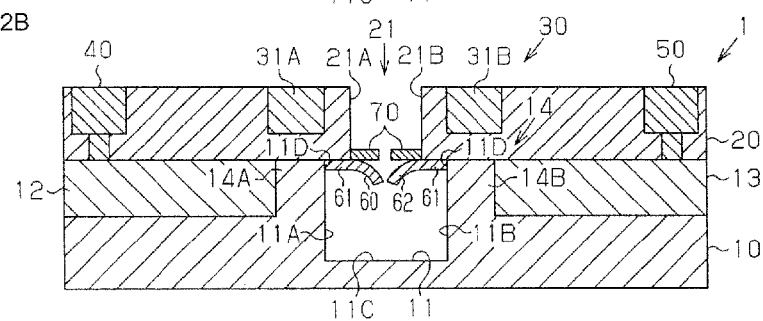
FIG. 2B is a sectional view illustrating the sectional structure of the insulated gate field effect transistor according to the first embodiment of the invention when the temperature of the conductive member is reduced after the state in FIG. 1A.

As illustrated in FIG. 2B, when the temperature of the bimetal 70 has changed from a temperature higher than the predetermined temperature to a temperature lower than the predetermined temperature due to the cutting of the conductive member 60, the end portions on the center side return to their original positions. At this time, the conductive member 60 is maintained in the cut state. Thus, the drain terminal 40 and the source terminal 50 are maintained in the conduction interrupted state.

As a range of temperatures higher than the predetermined temperature at which the conductive member 60 is cut, a temperature range is set in which the junction temperature of the FET 1 is the high limit temperature of an operation guarantee range. In other words, the shape of the bimetal 70 and the material and the thickness of the conductive member 60 are set in advance such that the conductive member 60 is cut when the temperature of the conduction member 60 enters the temperature range in which the junction temperature of the FET 1 is the high limit temperature.

Figure 3:
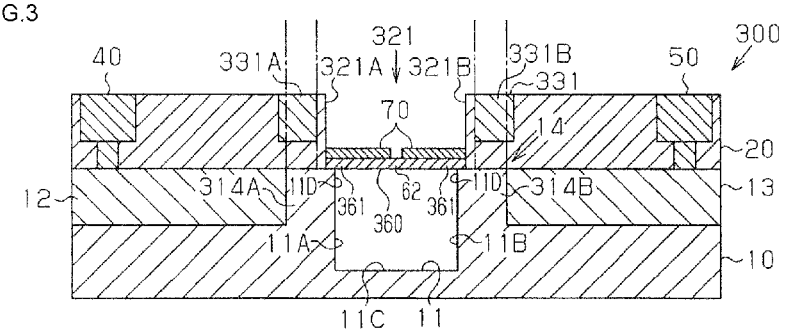
FIG. 3 is a sectional view illustrating the sectional structure of a virtual insulated gate field effect transistor.

The operation of the FET 1 will be described with reference to FIG. 1 and FIG. 3. FIG. 3 illustrates a virtual FET 300. The virtual FET 300 differs from the FET 1 in the configuration of the following portions, and is identical with the FET 1 in the configuration of the other portions. In the virtual FET 300, a conductive member 360 is supported by the surface of the semiconductor substrate 10. In the description of the virtual FET 300, the members common to those of the FET 1 will be denoted by the same reference numerals as those in the FET 1.

In the conductive member 360 of the virtual FET 300, both end portions 361 of the conductive member 360 are disposed on the upper surface of the semiconductor substrate 10. Thus, a first end face 321A of an insulator splitting portion 321 is located closer to the drain region 12 than the drain-side end face 11A. The drain region 12-side end portion of a first gate electrode portion 331A is located closer to the drain region 12 than the drain-side end face 11A. A second end face 321B of the insulator splitting portion 321 is located closer to the source region 13 than the source-side end face 11B. Thus, the source region 13-side end portion of a second gate electrode portion 331B is located closer to the source region 13 than the source-side end face 11B.

A first channel region 314A is formed at a position below the first gate electrode portion 331A. A second channel region 314B is formed at a position below the second gate electrode portion 331B. Therefore, there is a possibility that the first channel region 314A and the second channel region 314B may not reach the conductive member 360. If end portions of the conductive member 360 are extended in order to make the first channel region 314A and the second channel region 314B reach the conductive member 360, the conductive member 360 and the gate electrode portions 331A, 331B come into contact with each other. In this case, the virtual FET 300 does not function as an FET. Therefore, in the virtual FET 300, there is a possibility that stable conduction between the drain region 12 and the conductive member 360 may not be established. Further, there is a possibility that stable conduction between the source region 13 and the conductive member 360 may not be established.

On the other hand, as illustrated in FIG. 1, the FET 1 has the following structure. The source region 13-side end portion of the first gate electrode portion 31A extends up to the position of the drain-side end face 11A. The drain region 12-side end portion of the second gate electrode portion 31B extends up to the position of the source-side end face 11B. Thus, the first channel region 14A and the second channel region 14B reach the conductive member 60. When voltage is applied to the gate electrode 30, the channel region 14 is stably formed. Thus, in the FET 1, stable conduction between the drain region 12 and the conductive member 60 is established. Further, stable conduction between the source region 13 and the conductive member 60 is established.

Figure 4A:
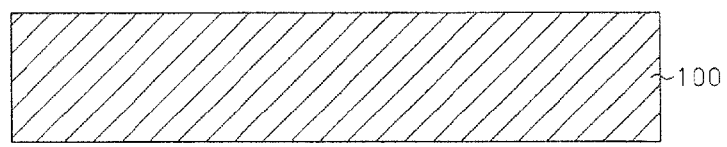
FIG. 4A, FIG. 4B and FIG. 4C are views illustrating the steps of forming an insulation groove and a positioning portion in a substrate material in a method of manufacturing the insulated gate field effect transistor according to the first embodiment.

A method of manufacturing the FET 1 will be described with reference to FIG. 4A to FIG. 8B. As illustrated in FIG. 4A, a substrate material 100 as a p-type silicon semiconductor is prepared. The substrate material 100 corresponds to a portion in which each element S1 of a silicon wafer S (refer to FIG. 7) is formed.

Figure 4B:
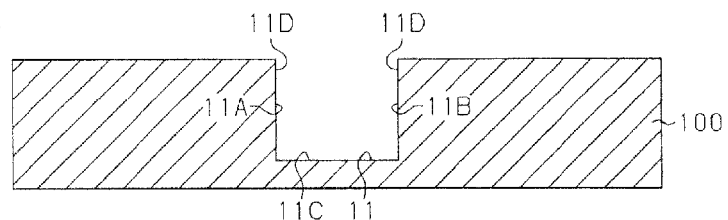

As illustrated in FIG. 4B, the insulation groove 11 is formed in the substrate material 100, as a recess extending in a depth direction that is perpendicular to the sheet on which FIG. 4B is drawn and that is away from a person seeing FIG. 4B. More specifically, the surface of the substrate material 100 is covered with a resist film having such a pattern that a portion of the substrate material 100, in which the insulation groove 11 will be formed, is exposed. Then, the substrate material 100 is etched using the resist film as a mask.

Figure 4C:
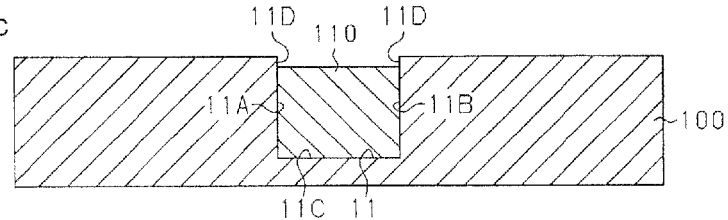

As illustrated in FIG. 4C, a positioning portion 110 is formed in the insulation groove 11. The surface of the positioning portion 110 is located closer to the bottom face 11C than the surface of the substrate material 100. The positioning portion 110 is formed as a glass film that is obtained by filling the insulation groove 11 with a glass material by, for example, a chemical vapor deposition (CVD) method.

Figure 5A:
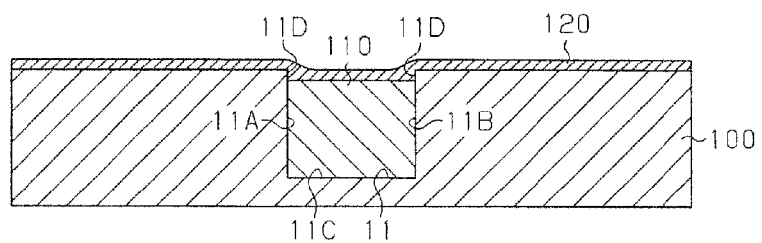
FIG. 5A, FIG. 5B and FIG. 5C are views illustrating the steps of forming the conductive member in the method of manufacturing the insulated gate field effect transistor according to the first embodiment.

As illustrated in FIG. 5A, a metal film 120 is formed on the surface of the substrate material 100 and the surface of the positioning portion 110. More specifically, the metal film 120 is formed on the surface of the substrate material 100 and the surface of the positioning portion 110 by a vapor deposition method. The surface of the metal film 120 formed on the surface of the positioning portion 110 is flush with the surface of the substrate material 100.

Figure 5B:
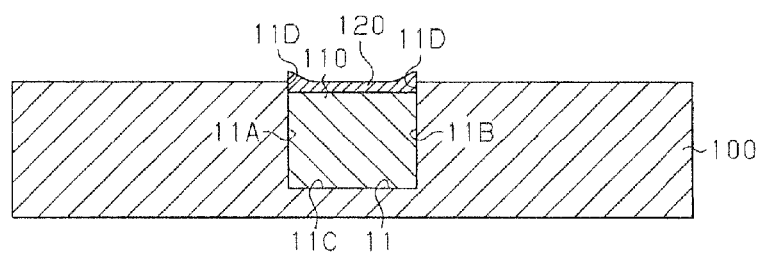

As illustrated in FIG. 5B, portions of the metal film 120 other than a portion formed on the surface of the positioning portion 110 are removed. More specifically, the surface of the metal film 120 is covered with a resist film having such a pattern that the portions of the metal film 120 other than the portion formed on the positioning portion 110 are exposed. Then, the metal film 120 is etched using the resist film as a mask such that unnecessary portions are removed.

Figure 5C:
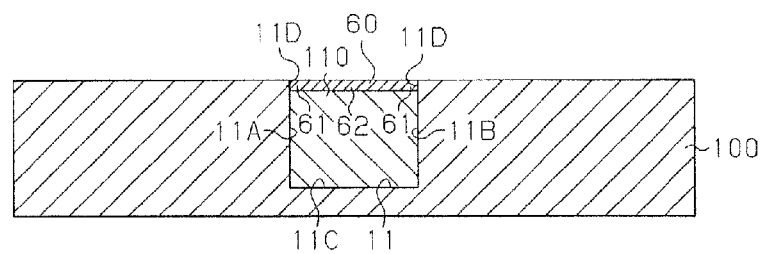

As illustrated in FIG. 5C, the metal film 120 is ground. As a result, the surface of the metal film 120 is flush with the surface of the substrate material 100. Through this work, the conductive member 60 that is supported by the opening portion 11D is formed.

Figure 6A:
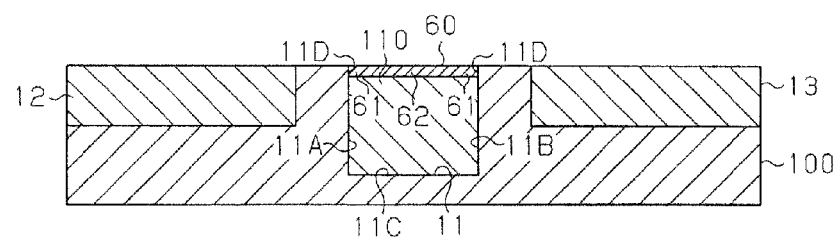
FIG. 6A, FIG. 6B, FIG. 6C and FIG. 6D are views illustrating the steps of forming a semiconductor substrate, a gate insulator, a gate electrode, a drain terminal, and a source terminal in the method of manufacturing the insulated gate field effect transistor according to the first embodiment.

As illustrated in FIG. 6A, the n-type drain region 12 and the n-type source region 13 are formed in the substrate material 100. More specifically, the substrate material 100 is covered with a resist film having such a pattern that portions of the substrate material 100, in which the drain region 12 and the source region 13 will be formed, are exposed. Then, the substrate material 100 is doped with an n-type dopant by an ion implantation method, using the resist film as a mask. Then, the drain region 12 and the source region 13, which are n-type semiconductor regions, are formed in the substrate material 100 by subjecting the substrate material 100 to a heat treatment.

Figure 6B:
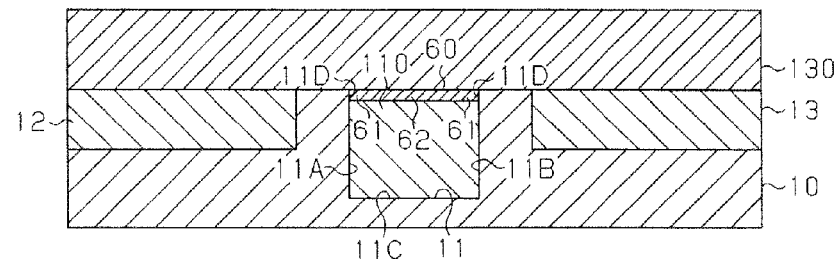

As illustrated in FIG. 6B, an oxide film 130 is formed on the surface of the substrate material 100 and the surface of the conductive member 60 by making the temperature of the substrate material 100 high under a high-temperature oxidizing atmosphere. Through this work, the semiconductor substrate 10 is formed.

Figure 6C:
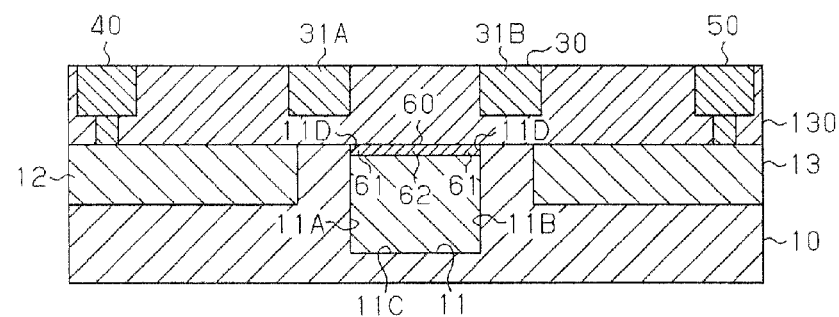

As illustrated in FIG. 6C, the gate electrode 30, the drain terminal 40, and the source terminal 50 are formed in the oxide film 130. Specifically, the gate electrode 30 is formed as follows. First, the surface of the oxide film 130 is covered with a resist film having such a pattern that portions of the oxide film 130, in which the first gate electrode portion 31A and the second gate electrode portion 31B will be formed, are exposed. Then, recesses are formed at the portions of the oxide film 130, in which the first gate electrode portion 31A and the second gate electrode portion 31B will be formed, by etching the oxide film 130 using the resist film as a mask. Then, polycrystalline silicon films, which will be the first gate electrode portion 31A and the second gate electrode portion 31B, are formed in the recesses by a CVD method. Note that, as the thickness of each of the silicon films, 0.4 mm or less is preferable.

Specifically, the drain terminal 40 and the source terminal 50 are formed as follows. First, the surface of the oxide film 130 is covered with a resist film having such a pattern that portions of the oxide film 130, in which the drain terminal 40 and the source terminal 50 will be formed, are exposed. Then, recesses are formed at the portions of the oxide film 130, in which the drain terminal 40 and the source terminal 50 will be formed, by etching the oxide film 130 using the resist film as a mask. Then, aluminum films, which will be the drain terminal 40 and the source terminal 50, are formed in the recesses by a sputtering method.

Figure 6D:
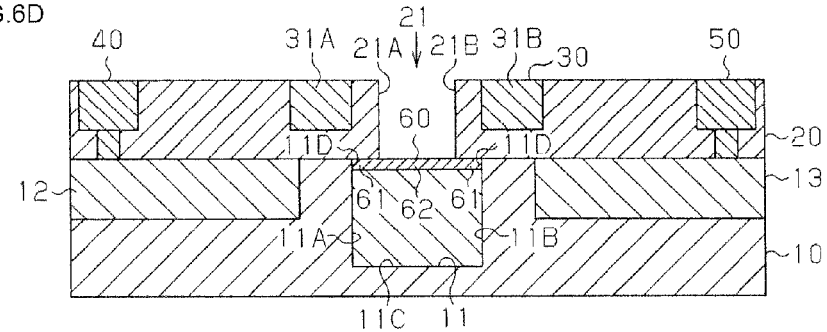

As illustrated in FIG. 6D, the insulator splitting portion 21 is formed in the oxide film 130. More specifically, the surface of the oxide film 130 is covered with a resist film. Then, the insulator splitting portion 21, which is a groove having the conductive member 60 as its bottom portion, is formed by etching the oxide film 130 using the resist film as a mask. Through this work, the gate insulator 20 is formed.

Figure 7:
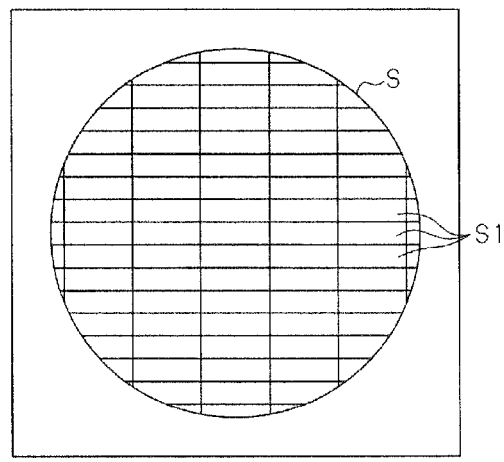
FIG. 7 is a view illustrating the step of cutting a silicon wafer in the method of manufacturing the insulated gate field effect transistor according to the first embodiment.

As illustrated in FIG. 7, a large number of elements S1, each having the semiconductor substrate 10, the gate insulator 20, the gate electrode 30, the drain terminal 40, the source terminal 50, and the conductive member 60, are formed in the single silicon wafer S. The elements S1 are separated into the individual elements S1 by cutting the silicon wafer S through dicing (singulation), whereby each individual element S1 is obtained.

Figure 8A:
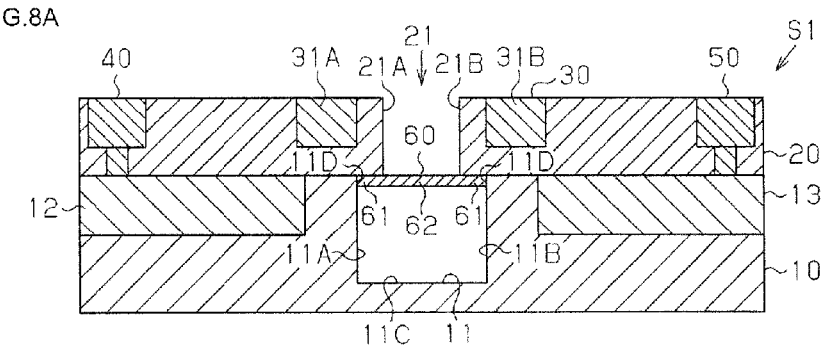
FIG. 8A is a view illustrating the step of crushing the positioning portion in the method of manufacturing the insulated gate field effect transistor according to the first embodiment.

As illustrated in FIG. 8A, each individual element S1 is irradiated with a laser beam by a laser beam irradiation device, so that the positioning portion 110 is crushed. It is possible to crush only the glass film that serves as the positioning portion 110 by focusing the laser beam from the laser irradiation device onto the glass film. Therefore, it is possible to minimize the influence of the crushing of the glass film on other portions such as the conductive member 60 and the semiconductor substrate 10. Then, fragments of the glass film are removed from the insulation groove 11. The fragments of the glass film are removed by cleaning the element S1 with a cleaning solution. In this way, the FET 1 that does not have the positioning portion 110, as illustrated in FIG. 8A, is formed.

Figure 8B:
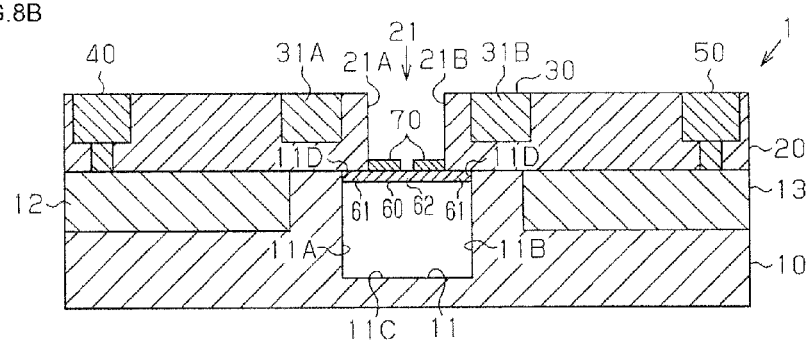
FIG. 8B is a view illustrating the step of attaching a bimetal to the FET in the method of manufacturing the insulated gate field effect transistor according to the first embodiment.

As illustrated in FIG. 8B, the bimetal 70 is fitted to the FET 1. One of the two bimetal portions of the bimetal 70 is fixed to a lower end portion of the first end face 21A. The other one of the two bimetal portions of the bimetal 70 is fixed to a lower end portion of the second end face 21B.

The FET 1 produces the following advantageous effects. In the FET 1, the conductive member 60 is supported by the drain-side end face 11A and the source-side end face 11B. That is, the first channel region 14A and the second channel region 14B are connected via the conductive member 60. Therefore, when the temperature of the conductive member 60 is higher than or equal to the predetermined temperature due to occurrence of an abnormality or the like in the FET 1, the conduction between the drain terminal 40 and the source terminal 50 is interrupted. Thus, it is possible to reduce the occurrence of a short-circuit fault.

In the FET 1, the source region 13-side end portion of the first gate electrode portion 31A is formed so as to extend up to the position of the drain-side end face 11A. Thus, the first channel region 14A is formed so as to extend up to the position of the drain-side end face 11A. The drain region 12-side end portion of the second gate electrode portion 31B is formed so as to extend up to the position of the source-side end face 11B. Thus, the second channel region 14B is formed so as to extend up to the position of the source-side end face 11B. Thus, the channel region 14 is stably formed.

As a method for reducing the occurrence of a short-circuit fault of the FET 1 to minimize the influence on other devices, there is a method in which a relay or the like is provided. However, if a relay or the like is provided, the configuration of the FET 1 is complicated and thus the size of the FET 1 is increased. In the FET 1, the occurrence of a short-circuit fault is reduced by the conductive member 60. Thus, it is possible to make the FET 1 more compact than that in a case where a relay or the like is provided.

The silicon wafer S is cut in order to separate it into the individual elements S1 in a state where each individual element S1 has the positioning portion 110. Then, the positioning portion 110 is removed from the cut individual element S1. Thus, cutting of the silicon wafer S is performed in a state where the strength of each element S1 is reinforced by the positioning portion 110. Thus, it is possible to reduce the occurrence of deformation and damage in the elements S1 at the time of the cutting of the silicon wafer S. As a result, is possible to suppress a decrease in yield due to insufficient strength of the elements S1.

The positioning portion 110 is made of a glass material that is more fragile than a material of each portion of the FET 1. Thus, it is possible to minimize the influence of removal of the glass film, which serves as the positioning portion 110, on the FET 1.

Next, a second embodiment of the invention will be described. The FET 200 according to the present embodiment differs from the FET 1 in the first embodiment in the configuration of the following portions, and is identical with the FET 1 in the configuration of the other portions. In the FET 200, a resin portion 280 is provided instead of the bimetal 70. In the description of the FET 200 in the second embodiment, the members common to those of the FET 1 will be denoted by the same reference numerals as those in the FET 1.

Figure 9A:
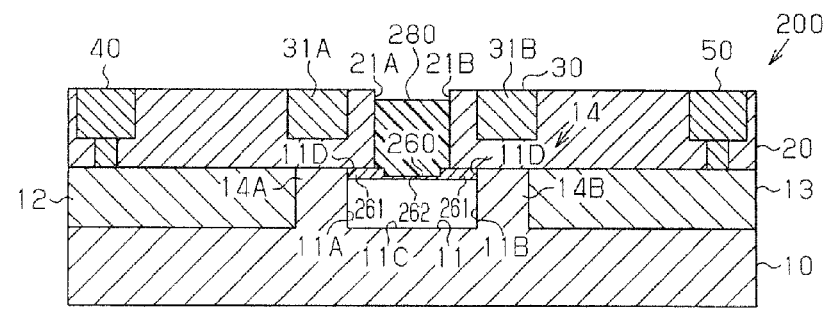
FIG. 9A is a sectional view illustrating the sectional structure of an insulated gate field effect transistor according to a second embodiment of the invention.

As illustrated in FIG. 9A, the FET 200 includes the semiconductor substrate 10, the gate insulator 20, the gate electrode 30, the drain terminal 40, the source terminal 50, a conductive member 260, and the resin portion 280.

The insulator splitting portion 21 is formed as a groove that has a bottom face defined by the conductive member 260, and that splits the gate insulator 20 into a portion on the first gate electrode portion 31A side and a portion on the second gate electrode portion 31B side. The conductive member 260 has end portions 261 on both sides in the lateral direction X, and an intermediate portion 262 between the both end portions 261. The surface of the conductive member 260 is flush with the surface of the semiconductor substrate 10.

The end portion 261 on the drain region 12 side is supported by the opening portion 11D of the drain-side end face 11A. The end portion 261 on the source region 13 side is supported by the opening portion 11D of the source-side end face 11B.

The resin portion 280 is disposed on the surface of the intermediate portion 262. The resin portion 280 is supported by the first end face 21A and the second end face 21B of the insulator splitting portion 21. The volume of the resin portion 280 is larger than the volume of a space formed by the insulation groove 11. The resin portion 280 is made of fluorine resin. As the fluorine resin, tetrafluoroethylene may be used.

Figure 9B:
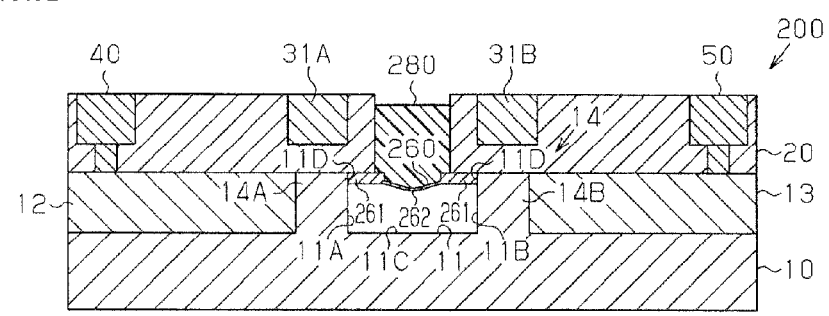
FIG. 9B is a sectional view illustrating the sectional structure of the insulated gate field effect transistor according to the second embodiment of the invention when the temperature of a conductive member is equal to or higher than a predetermined temperature.

A process leading to occurrence of an open fault in the FET 200 will be described. As illustrated in FIG. 9B, when the temperature of the conductive member 260 increases due to, for example, supply of excessively large current or voltage, the temperature of the resin portion 280 also increases. The resin portion 280 melts when the temperature thereof becomes high. Thus, the load which has been borne by the first end face 21A and the second end face 21B is applied to the conductive member 260. Thus, the intermediate portion 262 of the conductive member 260 is bent downward.

Figure 9C:
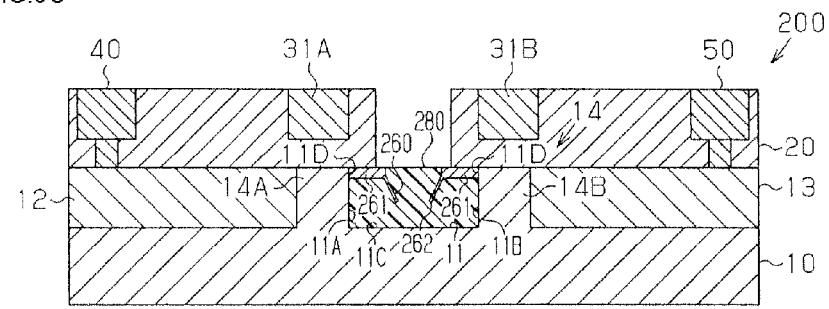
FIG. 9C is a sectional view illustrating the sectional structure of the insulated gate field effect transistor according to the second embodiment of the invention when the temperature of the conductive member is reduced after the state in FIG. 9B.

As illustrated in FIG. 9C, when the temperature of the conductive member 260 is higher than a predetermined temperature, the load applied to the intermediate portion 262 of the conductive member 260 exceeds the tolerance of the intermediate portion 262. At this time, the conductive member 260 is cut by the melted resin portion 280. The melted resin portion 280 moves into the insulation groove 11. In this way, the conduction between the first channel region 14A and the second channel region 14B is interrupted. Thus, the conduction between the drain region 12 and the source region 13 is interrupted. The conduction between the drain terminal 40 and the source terminal 50 is interrupted.

When the conductive member 260 is cut and thus the temperature thereof is changed from a temperature higher than the predetermined temperature to a temperature lower than the predetermined temperature, the resin portion 280 solidifies again in the insulation groove 11. At this time, the conductive member 260 is maintained in the cut state. Thus, the drain terminal 40 and the source terminal 50 are maintained in the conduction interrupted state.

As a range of temperatures higher than the predetermined temperature at which the conductive member 260 is cut, a temperature range is set in which the junction temperature of the FET 200 is the high limit temperature of an operation guarantee range. In other words, for example, the material of the resin portion 280, the weight of the resin portion 280, the material properties of the conductive member 260 and the thickness of the conductive member 260 are set in advance such that the conductive member 260 is cut when the temperature of the conduction member 260 enters the temperature range in which the junction temperature of the FET 200 is the high limit temperature.

A method of manufacturing the FET 200 will be described. The insulation groove 11, the positioning portion 110, and the conductive member 260 are formed in the substrate material 100, which serves as a p-type silicon semiconductor, through the works illustrated in FIG. 4A to FIG. 4C and FIG. 5A to FIG. 5C.

Figure 10A:
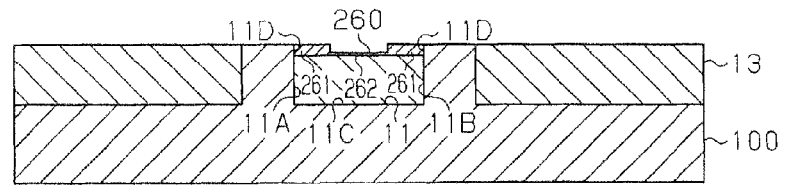
FIG. 10A, FIG. 10B, FIG. 10C and FIG. 10D are views illustrating the steps of forming a conductive member, a semiconductor substrate, a gate insulator, a gate electrode, a drain terminal, and a source terminal in a method of manufacturing the insulated gate field effect transistor according to the second embodiment.

As illustrated in FIG. 10A, the intermediate portion 262 of the conductive member 260 is formed to be thinner than the both end portions 261. More specifically, the surface of the conductive member 260 is covered with a resist film having such a pattern that the intermediate portion 262 is exposed. Then, the intermediate portion 262 is etched using the resist film as a mask. Thus, the n-type drain region 12 and the n-type source region 13 are formed in the substrate material 100.

Figure 10B:
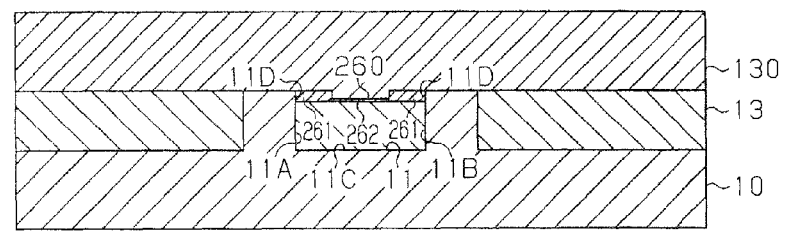

As illustrated in FIG. 10B, the oxide film 130 is formed on the surface of the substrate material 100 and the surface of the conductive member 260 by making the temperature of the substrate material 100 high under a high-temperature oxidizing atmosphere. Through this work, the semiconductor substrate 10 is formed.

Figure 10C:
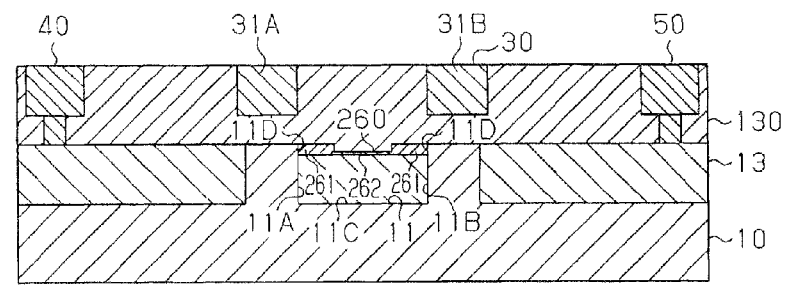
Figure 10D:
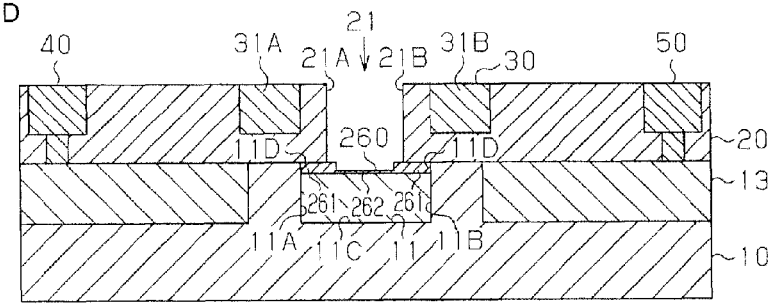

As illustrated in FIG. 10C, the gate electrode 30, the drain terminal 40, and the source terminal 50 are formed in the oxide film 130. As illustrated in FIG. 10D, the insulator splitting portion 21 is formed in the oxide film 130.

Figure 11:
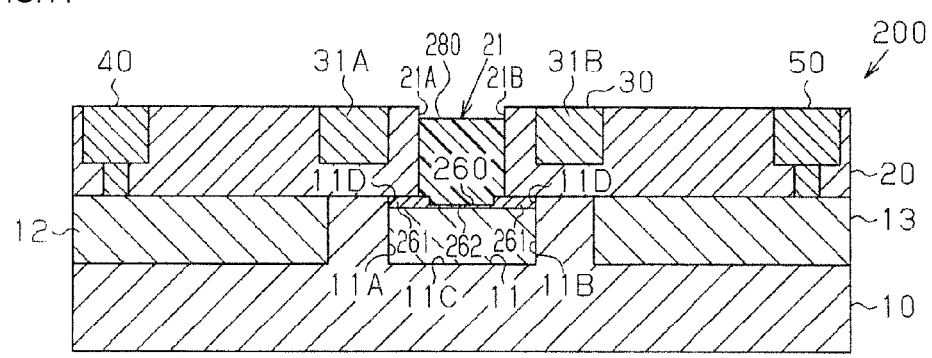
FIG. 11 is a view illustrating the step of forming a resin portion in the method of manufacturing the insulated gate field effect transistor according to the second embodiment.

As illustrated in FIG. 11, the resin portion 280 is formed. More specifically, the insulator splitting portion 21 is filled with melted fluorine resin such as tetrafluoroethylene. The fluorine resin solidifies, whereby the resin portion 280 is formed.

As illustrated in FIG. 7, a large number of elements S1, each having the semiconductor substrate 10, the gate insulator 20, the gate electrode 30, the drain terminal 40, the source terminal 50, and the conductive member 260, are formed in the single silicon wafer S. The elements S1 are separated into the individual elements S1 by cutting the silicon wafer S through dicing (singulation), whereby each individual element S1 is obtained.

Each individual element S1 is irradiated with a laser beam by a laser beam irradiation device, so that the positioning portion 110 is crushed. Then, fragments of the glass film are removed from the insulation groove 11. The fragments of the glass film are removed by cleaning the element S1 with a cleaning solution. In this way, the FET 200 that does not have the positioning portion 110, as illustrated in FIG. 9A, is formed.

The FET 200 produces the following advantageous effects in addition to the advantageous effects of the first embodiment described above. The FET 200 has the resin portion 280. The resin portion 280 melts when the temperature of the conductive member 260 is higher than or equal to the predetermined temperature. When the resin portion 280 has melted, the load applied to the conductive member 260 by the resin portion 280 increases. Thus, the conductive member 260 is cut by the resin portion 280. Therefore, when an abnormality occurs in the FET 200, it is possible to interrupt the conduction between the drain terminal 40 and the source terminal 50.

In the conductive member 260, the thickness of the intermediate portion 262 is smaller than the thickness of each end portion 261. Therefore, when the resin portion 280 has melted, the intermediate portion 262 of the conductive member 260 is cut more easily than in a case where the thickness of each end portion 261 is less than or equal to the thickness of the intermediate portion 262.

The thickness of each end portion 261 is larger than the thickness of the intermediate portion 262. Therefore, in a state where the resin portion 280 has not melted, the possibility that the conductive member 260 may fall off the drain-side end face 11A and the source-side end face 11B is lower than that in a case where the thickness of each end portion 261 is smaller than the thickness of the intermediate portion 262.

The volume of the resin portion 280 is larger than the volume of the space formed by the insulation groove 11. Thus, when the resin portion 280 has melted and moved into the insulation groove 11, the conductive member 260 cut into two pieces are fixed to the coagulated resin portion 280. Thus, the two pieces of the conductive member 260 are prevented from coming into contact with each other.

In the FET 200, the resin portion 280 is formed before the silicon wafer S is cut into the individual elements S1. Therefore, each element S1 is reinforced by the resin portion 280 at the time of the cutting of the silicon wafer S. Thus, it is possible to reduce the occurrence of deformation and damage in the elements S1 at the time of the cutting of the silicon wafer S. As a result, is possible to suppress a decrease in yield due to insufficient strength of the elements S1.

The invention includes embodiments other than the embodiments described above. Hereinafter, modified examples of each embodiment described above, as other embodiments of the invention, will be described. Note that, the modified examples described below may be combined with each other.

The FET 1 in the first embodiment includes the bimetal 70. However, the configuration of the FET 1 is not limited to this. A material other than bimetal, such as a shape memory alloy or a super-elastic alloy may be used instead of the bimetal 70, as long as the material is deformed with a temperature rise.

The FET 200 in the second embodiment includes the resin portion 280 made of fluorine resin. However, the configuration of the FET 200 is not limited to this. Any resin material may be adopted, if the resin material has insulation properties and melts at a temperature higher than or equal to a predetermined temperature.

In the FET 200 in the second embodiment, the volume of the resin portion 280 is larger than the volume of the space formed in the insulation groove 11. However, the configuration of the FET 200 is not limited to this. For example, in the FET 200 according to a modified example, the volume of the resin portion 280 is less than or equal to the volume of the space formed in the insulation groove 11.

The conductive member 60 in the first embodiment is cut due to deformation of the bimetal 70. Further, the conductive member 260 in the second embodiment is cut by the load applied by the resin portion 280. However, the configuration for cutting the conductive member 60, 260 is not limited to these configurations. Any configuration in which the conductive member 60, 260 is cut when temperature thereof is higher than or equal to a predetermined temperature may be adopted.

In the FET 1 in each embodiment described above, the source region 13-side end of the first gate electrode portion 31A coincides with the position of the drain-side end face 11A in the lateral direction X. However, the configuration of the FET 1 is not limited to this. For example, in the FET 1 according to a modified example, the source region 13-side end portion of the first gate electrode portion 31A is located between the drain-side end face 11A and the drain region 12.

In the FET 1 in each embodiment described above, the drain region 12-side end of the second gate electrode portion 31B coincides with the source-side end face 11B in the lateral direction X. However, the configuration of the FET 1 is not limited to this. For example, in the FET 1 according to a modified example, the drain region 12-side end of the second gate electrode portion 31B is located between the source-side end face 11B and the source region 13.

In the conductive member 60, 260 in the embodiments described above, each end portion 61, 261 is supported by the opening portion 11D. However, the configuration of the conductive member 60, 260 is not limited to this. For example, in the conductive member 60, 260 according to modified examples, end portions 61, 261 are supported by portions of the end faces 11A, 11B, the portions being closer to the bottom face 11C than the opening portion 11D.

The surface of the conductive member 60, 260 in the embodiments described above is flush with the surface of the semiconductor substrate 10. However, the configuration of the conductive member 60, 260 is not limited to this. For example, in the conductive member 60, 260 according to modified examples, a portion of the surface or the entire surface of the conductive member 60, 260 is located closer to the gate electrode 30 or closer to the bottom face 11C than the surface of the semiconductor substrate 10.

The conductive members 60 260 of the above-described embodiments are made of aluminum. However, the material of the conductive members 60, 260 is not limited to this. Any material having electric conductivity may be adopted.

In the FET 1, 200 in the embodiments described above, as a high-temperature range in which the conductive member 60, 260 is cut, a temperature range is set in which the junction temperature of the FET 1, 200 is the high limit temperature of an operation guarantee range. However, as a high-temperature range in which the conductive member 60, 260 is cut, any high temperature range in which occurrence of a short-circuit fault in the FET 1 or 200 can be reduced may be set.

The positioning portion 110 in each embodiment described above is made of a glass material. However, the configuration of the positioning portion 110 is not limited to this. Other materials such as a resin material that melts at a relatively low temperature may be adopted. In this case, the positioning portion 110 is melted by placing each individual element S1 under a high-temperature atmosphere after dicing (singulation) is performed under a low-temperature atmosphere. Then, the melted resin material is removed by making it flow out from the inside of the insulation groove 11. Note that, in the FET 200, in a case where the positioning portion 110 is made of a resin material, a resin material having a lower melting temperature than that of the resin portion 280 is adopted.

In the FET 1, 200 in the embodiments described above, the insulation groove 11 has the bottom face 11C. However, the configuration of the FET 1, 200 is not limited to this. For example, in the FET 1, 200 according to modified examples, a bottom portion of the insulation groove 11 is opened. In this case, at the time of manufacturing of the FET 1, 200, by sticking another wafer to the back side of the silicon wafer S, it is also possible to suppress separation of the semiconductor substrate 10.

In the method of manufacturing the FET 1, 200 in the embodiments described above, the silicon wafer S is cut by dicing (singulation). However, the method of manufacturing the FET 1, 200 is not limited to this. For example, in a method of manufacturing the FET 1, 200 according to modified examples, the silicon wafer S is cut by scribing.

The FET 1, 200 in the embodiments described above is applied to a p-channel type insulated gate field effect transistor. However, the FET 1, 200 may be applied to an n-channel type insulated gate field effect transistor.

What is claimed is:

1. An insulated gate field effect transistor comprising:
    a semiconductor substrate having a drain region, a source region, a channel region, and an insulation groove that splits the channel region into a first channel region located on the drain region side and a second channel region located on the source region side;
    a gate electrode having a first gate electrode portion that forms the first channel region in the semiconductor substrate, and a second gate electrode portion that forms the second channel region in the semiconductor substrate;
    a gate insulator that is located between the semiconductor substrate and the gate electrode and that insulates the gate electrode from the drain region and the source region; and
    a conductive member that is supported by a drain-side end face of the insulation groove, the drain-side end face being an end face on the drain region side, and a source-side end face of the insulation groove, the source-side end face being an end face on the source region side, and that is cut when a temperature of the conductive member is higher than or equal to a predetermined temperature.

2. The insulated gate field effect transistor according to claim 1, wherein:
    the first gate electrode portion is formed so as to extend up to a position of the drain-side end face on the source region side; and
    the second gate electrode portion is formed so as to extend up to a position of the source-side end face on the drain region side.

3. The insulated gate field effect transistor according to claim 2, wherein the conductive member is supported by an opening portion that is a portion of the drain-side end face, the portion being on the gate insulator side, and an opening portion that is a portion of the source-side end face, the portion being on the gate insulator side.

4. The insulated gate field effect transistor according to claim 3, further comprising:
    a resin portion, wherein
    the gate insulator has an insulator splitting portion,
    the insulator splitting portion is formed as a groove that has a bottom face defined by the conductive member and that splits the gate insulator into a portion on the first gate electrode portion side and a portion on the second gate electrode portion side,
    the resin portion is supported by an end face of the insulator splitting portion, the end face being on the source region side, and an end face of the insulator splitting portion, the end face being on the drain region side, and melts when the temperature of the conductive member is higher than or equal to the predetermined temperature, and the conductive member is cut by the melted resin portion.

5. The insulated gate field effect transistor according to claim 2, further comprising:
    a resin portion, wherein
    the gate insulator has an insulator splitting portion,
    the insulator splitting portion is formed as a groove that has a bottom face defined by the conductive member and that splits the gate insulator into a portion on the first gate electrode portion side and a portion on the second gate electrode portion side,
    the resin portion is supported by an end face of the insulator splitting portion, the end face being on the source region side, and an end face of the insulator splitting portion, the end face being on the drain region side, and melts when the temperature of the conductive member is higher than or equal to the predetermined temperature, and the conductive member is cut by the melted resin portion.

6. A method of manufacturing the insulated gate field effect transistor according to claim 2, comprising:
    a step of forming a recess in a substrate material of the semiconductor substrate;
    a step of forming a positioning portion in the recess such that the positioning portion extends up to a position lower than an opening portion of the recess;
    a step of forming the conductive member on a surface of the positioning portion;
    a step of forming the drain region and the source region in the substrate material;
    a step of forming the semiconductor substrate by forming the gate insulator on a surface of the drain region, a surface of the source region, and a surface of the conductive member; and
    a step of removing the positioning portion from the semiconductor substrate.

7. A method of manufacturing the insulated gate field effect transistor according to claim 3, comprising:
    a step of forming a recess in a substrate material of the semiconductor substrate;
    a step of forming a positioning portion in the recess such that the positioning portion extends up to a position lower than an opening portion of the recess;
    a step of forming the conductive member on a surface of the positioning portion;
    a step of forming the drain region and the source region in the substrate material;
    a step of forming the semiconductor substrate by forming the gate insulator on a surface of the drain region, a surface of the source region, and a surface of the conductive member; and
    a step of removing the positioning portion from the semiconductor substrate.

8. The insulated gate field effect transistor according to claim 1, wherein the conductive member is supported by an opening portion that is a portion of the drain-side end face, the portion being on the gate insulator side, and an opening portion that is a portion of the source-side end face, the portion being on the gate insulator side.

9. The insulated gate field effect transistor according to claim 8, further comprising:
    a resin portion, wherein
    the gate insulator has an insulator splitting portion, the insulator splitting portion is formed as a groove that has a bottom face defined by the conductive member and that splits the gate insulator into a portion on the first gate electrode portion side and a portion on the second gate electrode portion side, the resin portion is supported by an end face of the insulator splitting portion, the end face being on the source region side, and an end face of the insulator splitting portion, the end face being on the drain region side, and melts when the temperature of the conductive member is higher than or equal to the predetermined temperature, and the conductive member is cut by the melted resin portion.

10. A method of manufacturing the insulated gate field effect transistor according to claim 8, comprising:
a step of forming a recess in a substrate material of the semiconductor substrate;
a step of forming a positioning portion in the recess such that the positioning portion extends up to a position lower than an opening portion of the recess;
a step of forming the conductive member on a surface of the positioning portion;
a step of forming the drain region and the source region in the substrate material;
a step of forming the semiconductor substrate by forming the gate insulator on a surface of the drain region, a surface of the source region, and a surface of the conductive member; and
a step of removing the positioning portion from the semiconductor substrate.

11. The insulated gate field effect transistor according to claim 1, further comprising:
a resin portion, wherein
the gate insulator has an insulator splitting portion,
the insulator splitting portion is formed as a groove that has a bottom face defined by the conductive member and that splits the gate insulator into a portion on the first gate electrode portion side and a portion on the second gate electrode portion side,
the resin portion is supported by an end face of the insulator splitting portion, the end face being on the source region side, and an end face of the insulator splitting portion, the end face being on the drain region side, and melts when the temperature of the conductive member is higher than or equal to the predetermined temperature, and
the conductive member is cut by the melted resin portion.

12. The insulated gate field effect transistor according to claim 11, wherein, in the conductive member, a thickness of an intermediate portion between an end portion on the drain-side end face side and an end portion on the source-side end face side is smaller than a thickness of each of the end portion on the drain-side end face side and the end portion on the source-side end face side.

13. A method of manufacturing the insulated gate field effect transistor according to claim 12, comprising:
a step of forming a recess in a substrate material of the semiconductor substrate;
a step of forming a positioning portion in the recess such that the positioning portion extends up to a position lower than an opening portion of the recess;
a step of forming the conductive member on a surface of the positioning portion;
a step of forming the drain region and the source region in the substrate material;
a step of forming the semiconductor substrate by forming the gate insulator on a surface of the drain region, a surface of the source region, and a surface of the conductive member; and
a step of removing the positioning portion from the semiconductor substrate.

14. A method of manufacturing the insulated gate field effect transistor according to claim 11, comprising:
a step of forming a recess in a substrate material of the semiconductor substrate;
a step of forming a positioning portion in the recess such that the positioning portion extends up to a position lower than an opening portion of the recess;
a step of forming the conductive member on a surface of the positioning portion;
a step of forming the drain region and the source region in the substrate material;
a step of forming the semiconductor substrate by forming the gate insulator on a surface of the drain region, a surface of the source region, and a surface of the conductive member; and
a step of removing the positioning portion from the semiconductor substrate.

15. A method of manufacturing the insulated gate field effect transistor according to claim 1, comprising:
a step of forming a recess in a substrate material of the semiconductor substrate;
a step of forming a positioning portion in the recess such that the positioning portion extends up to a position lower than an opening portion of the recess;
a step of forming the conductive member on a surface of the positioning portion;
a step of forming the drain region and the source region in the substrate material;
a step of forming the semiconductor substrate by forming the gate insulator on a surface of the drain region, a surface of the source region, and a surface of the conductive member; and
a step of removing the positioning portion from the semiconductor substrate.

* * * * *